(12) United States Patent
Yoneta et al.

(10) Patent No.: US 7,148,551 B2
(45) Date of Patent: Dec. 12, 2006

(54) SEMICONDUCTOR ENERGY DETECTOR

(75) Inventors: Yasuhito Yoneta, Hamamatsu (JP);
Hiroshi Akahori, Hamamatsu (JP);
Masaharu Muramatsu, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 0 days.

(21) Appl. No.: 10/262,859

(22) Filed: Oct. 3, 2002

(65) Prior Publication Data
US 2003/0034496 A1 Feb. 20, 2003

Related U.S. Application Data

(63) Continuation-in-part of application No. PCT/JP01/02568, filed on Mar. 28, 2001.

(30) Foreign Application Priority Data

Apr. 4, 2000 (JP) ............... P2000-102620
Apr. 4, 2000 (JP) ............... P2000-102625

(51) Int. Cl.
*H01L 31/00* (2006.01)
(52) U.S. Cl. ............ 257/443; 257/447; 257/448; 257/459; 257/465; 257/E33.076
(58) Field of Classification Search .......... 257/86, 257/46, 87, 106, 656, 233, 431–438, 447, 257/439, 255, 258, 225, 450, 465, 461–464, 257/466, 432, 443, 459, 452, 457, E33.076; 438/48; 136/255
See application file for complete search history.

(56) References Cited

U.S. PATENT DOCUMENTS

| | | | | |
|---|---|---|---|---|
| 5,449,943 A | * | 9/1995 | Kasai et al. | 257/437 |
| 5,519,247 A | * | 5/1996 | Arbus et al. | 257/437 |
| 5,633,526 A | * | 5/1997 | Kudo et al. | 257/431 |
| 5,777,352 A | | 7/1998 | Reele | 257/184 |
| 5,961,742 A | * | 10/1999 | Tange et al. | 136/256 |
| 6,114,685 A | | 9/2000 | Sato et al. | |
| 6,340,836 B1 | * | 1/2002 | Shikata | 257/544 |
| 6,354,595 B1 | * | 3/2002 | Vieux et al. | 277/312 |

FOREIGN PATENT DOCUMENTS

| | | |
|---|---|---|
| JP | 3-148869 | 6/1991 |
| JP | 5-150049 | 6/1993 |
| JP | 6-140613 | 5/1994 |
| JP | 9-331051 | 12/1997 |
| JP | 10-209417 | 8/1998 |

* cited by examiner

Primary Examiner—B. William Baumeister
Assistant Examiner—Dana Farahani
(74) Attorney, Agent, or Firm—Drinker Biddle & Reath LLP

(57) ABSTRACT

A semiconductor energy detector includes a semiconductor substrate comprised of a semiconductor of a first conductivity type, into which an energy ray of a predetermined wavelength range is incident from an incident surface thereof. A semiconductor energy detector includes a plurality of diffusion regions of a second conductivity type comprised of a semiconductor of a second conductivity type and a diffusion region of the first conductivity type comprised of a semiconductor of the first conductivity type higher in impurity concentration than the semiconductor substrate. The diffusion regions of a second conductivity type and the diffusion region of the first conductivity type are provided on a surface opposite to the incident surface of said semiconductor substrate. Each first conductivity type semiconductor substrate side of pn junctions, formed at the area of interface between the semiconductor substrate and each of the diffusion regions of the second conductivity type, is commonly connected.

15 Claims, 6 Drawing Sheets

SEMICONDUCTOR ENERGY DETECTOR

RELATED APPLICATION

This is a continuation-in-part application of application Ser. No. PCT/JP01/02568 filed on Mar. 28, 2001, now pending.

BACKGROUND OF THE INVENTION

1. Field of the Invention

The present invention relates to a semiconductor energy detector for detecting an energy ray such as radiation.

2. Related Background Art

As this type of the semiconductor energy detector, for example, one as disclosed in Japanese Patent Laid-Open Publication H5-150049 (published in 1993) has been known. This semiconductor energy detector disclosed in Japanese Patent Laid-Open Publication H5-150049 includes an N-type silicon wafer. A large number of grooves are formed on a surface of this silicon wafer, and a P-type diffusion region is formed so as to be located on a bottom portion of each groove. Then, an electrode composed of metal such as aluminum is formed on the surface side of the silicon wafer, and is electrically connected to a part of the P-type diffusion region. On a full back surface side thereof, an electrode composed of metal such as aluminum is formed. Moreover, a scintillator is fixed to each groove in an insertion manner.

SUMMARY OF THE INVENTION

However, since the electrode is provided on an incident surface side (surface side of the silicon wafer) of scintillation light (radiation) in the semiconductor energy detector constituted as described above, it becomes impossible to detect the scintillation light in a portion where the electrode is provided. Thus, there have been limitations on enlarging an area of a portion where it becomes possible to detect the scintillation light in the semiconductor energy detector.

The present invention was created in consideration of the above-described point. An object of the present invention is to provide a semiconductor energy detector capable of enlarging the area of the portion where it becomes possible to detect the energy ray.

In order to attain the foregoing object, a semiconductor energy detector of the present invention includes: a semiconductor substrate comprised of a semiconductor of a first conductivity type, onto which an energy ray of a predetermined wavelength range is incident from an incident surface thereof, characterized in that a diffusion region of a second conductivity type, the diffusion region being comprised of a semiconductor of the second conductivity type, and a diffusion region of a first conductivity type, the diffusion region being comprised of a semiconductor of the first conductivity type higher in impurity concentration than the semiconductor substrate, are provided on a surface opposite to the incident surface of the semiconductor substrate.

Since the diffusion region of the second conductivity type and the diffusion region of the first conductivity type are provided on the surface opposite to the incident surface of the semiconductor substrate, no electrode is provided on the incident surface of the semiconductor substrate, thus making it possible to enlarge the area of the portion where it becomes possible to detect the energy ray.

The semiconductor energy detector of the present invention may be characterized in that a scintillator is optically connected to the incident surface of the semiconductor substrate.

Since the scintillator is optically connected to the incident surface of the semiconductor substrate, the area of the portion where it becomes possible to detect the scintillation light can be enlarged.

The semiconductor energy detector of the present invention may be characterized in that, in the semiconductor substrate, a region that is not depleted from the surface opposite to the incident surface of the semiconductor substrate to the incident surface is provided in a completely depleted state where depletion is performed from the surface opposite to the incident surface of the semiconductor substrate to the incident surface.

Thus, when a bias voltage is being applied through the diffusion region of the first conductivity type, the adjacent depletion regions are connected below the diffusion region of the first conductivity type, and the bias voltage cannot be applied to the diffusion region of the first conductivity type any more. However, even after the adjacent depletion regions are connected below the diffusion region of the first conductivity type, if the region that is not depleted from the surface opposite to the incident surface of the semiconductor substrate to the incident surface is provided in the semiconductor substrate, the bias voltage can be continuously applied through the region that is not depleted from the surface opposite to the incident surface of the semiconductor substrate to the incident surface, thus making it possible to further deplete the semiconductor substrate. As a result of this, it becomes possible to restrict the lowering of a detection sensitivity and a response rate for the energy ray.

The semiconductor energy detector of the present invention may be characterized in that the diffusion region of the first conductivity type includes: a first diffusion region of the first conductivity type for separating the diffusion regions of the second conductivity type, the first diffusion region of the first conductivity type being provided between the diffusion regions of the second conductivity type; and a second diffusion region of the first conductivity type formed to be wider than the first diffusion region of the first conductivity type, the second diffusion region of the first conductivity type being provided on the outside of an array of the diffusion regions of the second conductivity type.

The diffusion region of the first conductivity type includes: the first diffusion region of the first conductivity type for separating the diffusion regions of the second conductivity type, the diffusion region of the first conductivity type being provided between the diffusion regions of the second conductivity type; and the second diffusion region of the first conductivity type formed to be wider than the first diffusion region of the first conductivity type, the second diffusion region of the first conductivity type being provided on the outside of the array of the diffusion regions of the second conductivity type. Thus, a constitution capable of providing the region that is not depleted from the surface opposite to the incident surface of the semiconductor substrate to the incident surface in the completely depleted state where the depletion is performed from the surface opposite to the incident surface of the semiconductor substrate to the incident surface can be realized in the semiconductor substrate simply at low cost.

Moreover, the semiconductor energy detector of the present invention may be characterized in that a sum of a width of the diffusion region of the second conductivity type adjacent to the second diffusion region of the first conductivity type and a width of the second diffusion region of the first conductivity type is set equal to a sum of a width of the diffusion region of the second conductivity type that is not adjacent to the second diffusion region of the first conductivity type and a width of the first diffusion region of the first conductivity type.

The sum of the width of the diffusion region of the second conductivity type that is adjacent to the second diffusion region of the first conductivity type and the width of the second diffusion region of the first conductivity type is set equal to the sum of the width of the diffusion region of the second conductivity type that is not adjacent to the second diffusion region of the first conductivity type and the width of the first diffusion region of the first conductivity type. Thus, a width of a unit region including the diffusion region of the second conductivity type adjacent to the second diffusion region of the first conductivity type becomes equal to a width of a unit region including the diffusion region of the second conductivity type that is not adjacent to the second diffusion region of the first conductivity type. Thus, particularly in the case of arraying a plurality of the semiconductor substrates, each having the diffusion region of the second conductivity type and the diffusion region of the first conductivity type provided therein, widths of all the unit regions become equal, thus making it possible to further enlarge the area of the portion where it becomes possible to detect the energy ray at the same detectivity.

Moreover, the semiconductor energy detector of the present invention may be characterized in that the second diffusion region of the first conductivity type is provided on a periphery of the semiconductor substrate.

The second diffusion region of the first conductivity type is provided on the periphery of the semiconductor substrate. Thus, on the periphery of the semiconductor substrate, the undepleted region exists below the second diffusion region of the first conductivity type, and thus it is possible to restrict the increase of a leakage current generated by a connection of the depletion region to the periphery of the semiconductor substrate.

Moreover, the semiconductor energy detector of the present invention may be characterized in that a plurality of the diffusion regions of the second conductivity type are arrayed at a predetermined interval, the first diffusion regions of the first conductivity type for separating the diffusion region of the second conductivity type is provided between the diffusion regions of the second conductivity type, the first diffusion regions being comprised of the semiconductor of the first conductivity type higher in impurity concentration than the semiconductor substrate, and the second diffusion region of the first conductivity type is provided on an outside of an array of the diffusion regions of the second conductivity type, the second diffusion region being formed to be wider than the first diffusion region of the first conductivity type and being comprised of the semiconductor of the first conductivity type higher in impurity concentration than the semiconductor substrate.

The diffusion regions of the second conductivity type, the first diffusion region of the first conductivity type and the second diffusion region of the first conductivity type are provided on the surface side opposite to the incident surface of the semiconductor substrate. Therefore, no insensitive region caused by extracting an electrode is formed on the incident surface side of the energy ray, thus making it possible to enlarge the area of the portion where it becomes possible to detect the energy ray.

When the bias voltage is being applied through the first diffusion region of the first conductivity type, the depletion regions adjacent to each other are connected below the first diffusion region of the first conductivity type, and the bias voltage cannot be applied to the first diffusion region of the first conductivity type any more. However, on the outside of the array of the diffusion regions of the second conductivity type, the second diffusion region of the first conductivity type is provided, which is formed to be wider than the first diffusion region of the first conductivity type and comprised of the semiconductor of the first conductivity type higher in impurity concentration than the semiconductor substrate. Therefore, even after the adjacent depletion regions are connected to each other below the first diffusion region of the first conductivity type, the bias voltage can be continuously applied through the second diffusion region of the first conductivity type, thus making it possible to further advance the depletion of the semiconductor substrate. As a result of this, in the semiconductor energy detector, it becomes possible to restrict the lowering of a detection sensitivity and a response rate for the energy ray.

Moreover, the semiconductor energy detector of the present invention may be characterized in that the sum of a width of the diffusion region of the second conductivity type adjacent to the second diffusion region of the first conductivity type and the width of the second diffusion region of the first conductivity type is set equal to the sum of the width of the diffusion region of the second conductivity type that is not adjacent to the second diffusion region of the first conductivity type and the width of the first diffusion region of the first conductivity type.

The sum of the width of the diffusion region of the second conductivity type adjacent to the second diffusion region of the first conductivity type and the width of the second diffusion region of the first conductivity type is set equal to the sum of the width of the diffusion region of the second conductivity type that is not adjacent to the second diffusion region of the first conductivity type and the width of the first diffusion region of the first conductivity type. Thus, a width of a unit region including the diffusion region of the second conductivity type adjacent to the second diffusion region of the first conductivity type becomes equal to a width of a unit region including the diffusion region of the second conductivity type that is not adjacent to the second diffusion region of the first conductivity type. Thus, particularly in the case of arraying a plurality of the semiconductor energy detectors of the present invention, the widths of all the unit regions become equal, thus making it possible to further enlarge the area of the portion where it becomes possible to detect the energy ray at the same detectivity.

Moreover, the semiconductor energy detector of the present invention may be characterized in that the second diffusion region of the first conductivity type is provided on a periphery of the semiconductor substrate.

The second diffusion region of the first conductivity type is provided on the periphery of the semiconductor substrate. Thus, on the periphery of the semiconductor substrate, the undepleted region exists below the second diffusion region of the first conductivity type, and thus it is possible to restrict the increase of a leakage current generated by a reach of the depletion region to the periphery of the semiconductor substrate.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
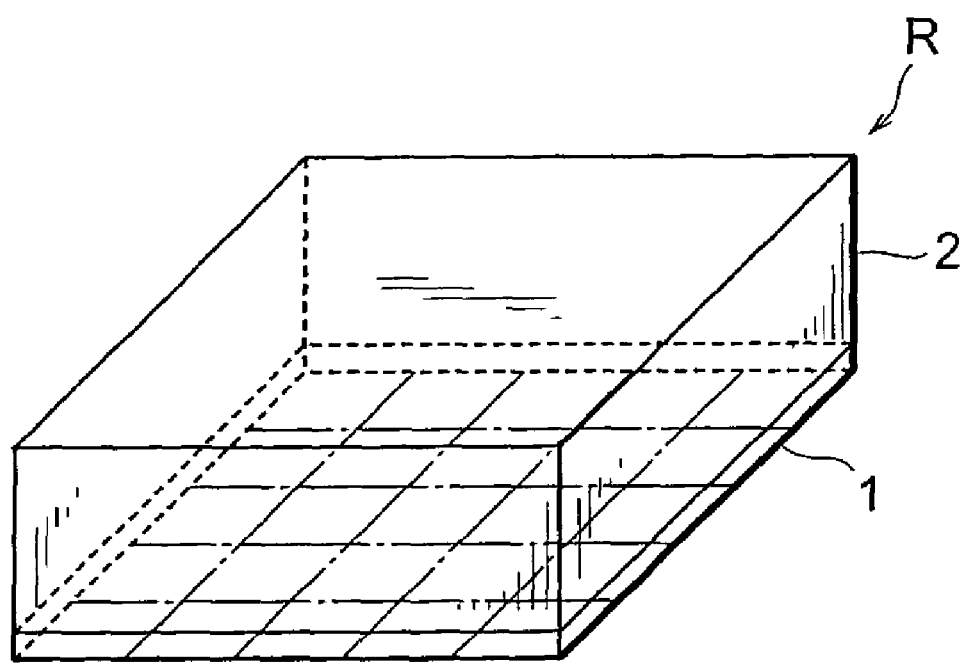
FIG. 1 is a perspective view showing an energy ray detector.

Description will be made for an energy ray detector according to an embodiment of the present invention with reference to the drawings. Note that, in the respective drawings, the same reference numerals will be used for the same elements or elements having the same functions, and repeated description will be omitted.

As shown in FIG. 1, an energy ray detector R includes a photodiode array 1 and a scintillator 2, and functions as a radiation detector. The scintillator 2 is optically connected to one surface (incident surface) side of the photodiode array 1, and is constituted such that scintillation light occurring when radiation is incident onto the scintillator 2 is made incident onto the photodiode array 1. Note that, on the surface of the scintillator 2, onto which the radiation is incident, Al, Cr or the like may be evaporated to form a reflection film that transmits the incident radiation therethrough and reflects the scintillation light from the scintillator 2.

Next, description will be made for a constitution of the photodiode array 1 with reference to FIG. 2 and FIG. 3. In this embodiment, as the photodiode array 1, a back-surface-incident-type photodiode array of a complete depletion type, of which number of photodiodes is 25 (5×5), is used.

Figure 2:
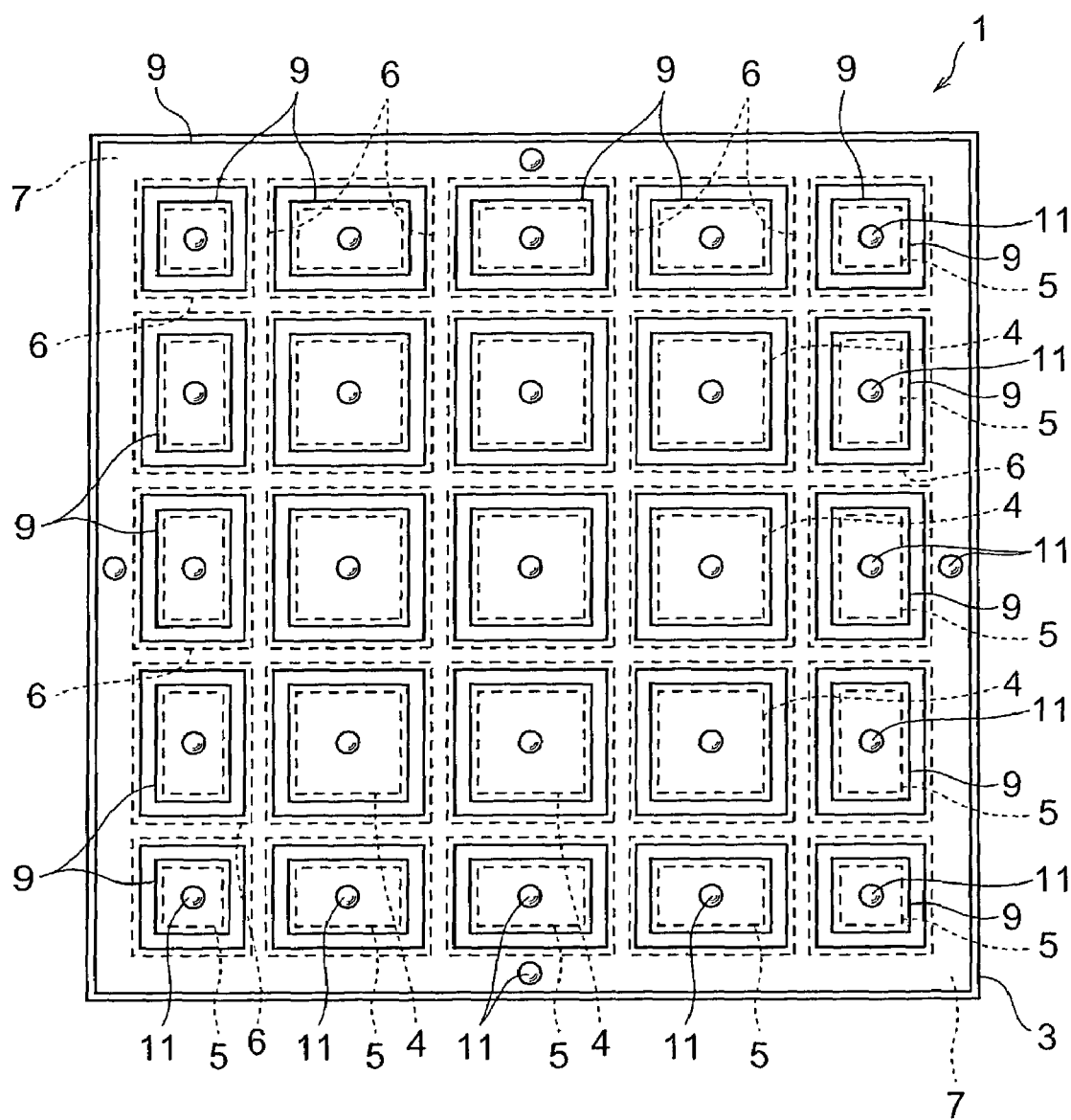
FIG. 2 is a plan view showing a back-surface-incident-type photodiode array included in the energy ray detector.
Figure 3:
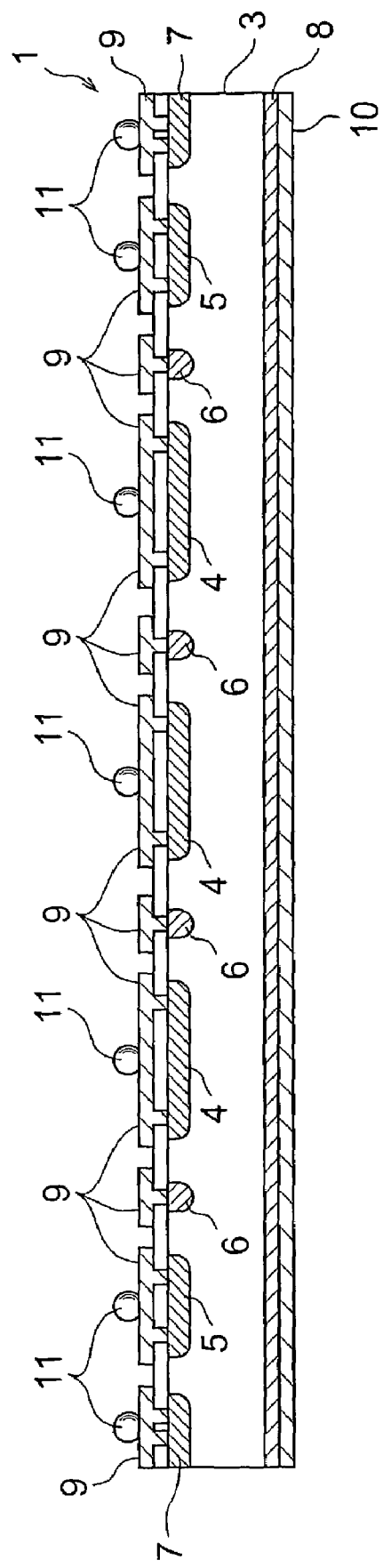
FIG. 3 is a schematic view showing a cross-sectional structure of the back-surface-incident-type photodiode array included in the energy ray detector.

As shown in FIG. 2 and FIG. 3, the back-surface-incident-type photodiode array 1 includes a semiconductor substrate 3, and on this semiconductor substrate 3, the photodiode array is formed. The semiconductor substrate 3 is composed of a high-resistance N-type silicon substrate having a wafer thickness of 0.3 mm and a specific resistance of 5 kΩ·cm.

The photodiode array 1 includes P$^+$ diffusion regions 4 and 5 as diffusion regions of a second conductivity type, an N$^+$ channel stop layer 6 as a first diffusion region of a first conductivity type, an N$^+$ channel stop layer 7 as a second diffusion region of the first conductivity type, an N$^+$ diffusion region 8, wiring 9 composed of aluminum or the like, and an AR (anti-reflective) coating layer 10. The P$^+$ diffusion regions 4 and 5 and the N$^+$ channel stop layers 6 and 7 are provided on a surface side opposite to the incident surface of the semiconductor substrate 3, onto which the scintillation light is incident from the scintillator 2. The N$^+$ diffusion region 8 is provided on an incident surface side of the semiconductor substrate 3, onto which the scintillation light is incident from the scintillator 2. On the N$^+$ diffusion region 8, the AR (anti-reflective) coating layer 10 is provided. The N$^+$ diffusion region 8 is composed of a semiconductor of the first conductivity type higher in impurity concentration than the semiconductor substrate 3, and a surface concentration thereof is set at approximately $1.0 \times 10^{19}$ cm$^{-3}$. The scintillator 2 is optically connected to the surface (incident surface) opposite to the surface of the semiconductor substrate 3, on which the P$^+$ diffusion regions 4 and 5 and the N$^+$ channel stop layers 6 and 7 are provided.

The P$^+$ diffusion regions 4 and 5 have surface concentrations set at approximately $1.0 \times 10^{20}$ cm$^{-3}$, and 5×5 (25) elements thereof are arrayed at a predetermined interval (in this embodiment, approximately 500 μm) spaced therebetween.

The N$^+$ channel stop layer 6 is composed of the semiconductor of the first conductivity type higher in impurity concentration than the semiconductor substrate 3, and a surface concentration of the N$^+$ channel stop layer 6 is set at approximately $1.0 \times 10^{19}$ cm$^{-3}$. Moreover, the N$^+$ channel stop layer 6 is provided between the P$^+$ diffusion regions (the P$^+$ diffusion regions 4 and 5; the P$^+$ diffusion regions 4 and 4) adjacent to each other, and exhibits a lattice shape so as to separate the P$^+$ diffusion regions (the P$^+$ diffusion regions 4 and 5; the P$^+$ diffusion regions 4 and 4). Intervals between the P$^+$ diffusion region (the P$^+$ diffusion region 4; the P$^+$ diffusion region 5) and the N$^+$ channel stop layer 6 are set at approximately 150 μm. A width of the N$^+$ channel stop layer 6 is set at approximately 200 μm.

The N$^+$ channel stop layer 7 is composed of the semiconductor of the first conductivity type higher in impurity concentration than the semiconductor substrate 3, and a surface concentration of the N$^+$ channel stop layer 7 is set at approximately $1.0 \times 10^{19}$ cm$^{-3}$. Moreover, the N$^+$ channel stop layer 7 is provided in the form of frame on the outside of the array of the P$^+$ diffusion regions 4 and 5 continuously with the N$^+$ channel stop layer 6. An interval between the P$^+$ diffusion region 5 and the N$^+$ channel stop layer 7 is set at approximately 300 μm, and a distance from the P$^+$ diffusion region 5 including the N$^+$ channel stop layer 7 to a periphery of the semiconductor substrate 3 is approximately 900 μm. A width of the N$^+$ channel stop layer 7 is set at approximately 600 μm, and the N$^+$ channel stop layer 7 is set wider than the N$^+$ channel stop layer 6.

The P$^+$ diffusion region 5 that is adjacent to the N$^+$ channel stop layer 7 is set shorter in width as compared with the P$^+$ diffusion region 4 that is not adjacent to the N$^+$ channel stop layer 7. The sum of the width of the P$^+$ diffusion region 5 that is adjacent to the N$^+$ channel stop layer 7 and the width of the N$^+$ channel stop layer 7 is set equal to the sum of the width of the P$^+$ diffusion region 4 that is not adjacent to the N$^+$ channel stop layer 7 and the width of the N$^+$ channel stop layer 6. Thus, though an area of the P$^+$ diffusion region 5 becomes smaller than an area of the P$^+$ diffusion region 4, a width of a photodiode unit cell (unit region) including the P$^+$ diffusion region 5 becomes equal to the width of the photodiode unit cell (unit region) including the P$^+$ diffusion region 4. Therefore, the areas of the photodiode unit cells (unit regions) of the photodiode array 1 become all equal.

On the wiring 9 electrically connected to each of the P$^+$ diffusion regions 4 and 5 and the N$^+$ channel stop layers 6 and 7, a bump 11 is formed. Electrical connections of the P$^+$ diffusion regions 4 and 5 and the N$^+$ channel stop layers 6 and 7 are made on the surface side opposite to the incident surface of the semiconductor substrate 3. The bump 11 is connected to an output readout circuit (not shown) by flip chip process.

Next, description will be made for an operation of the photodiode array 1 constituted as described above with reference to FIG. 4 and FIG. 5.

Figure 4:
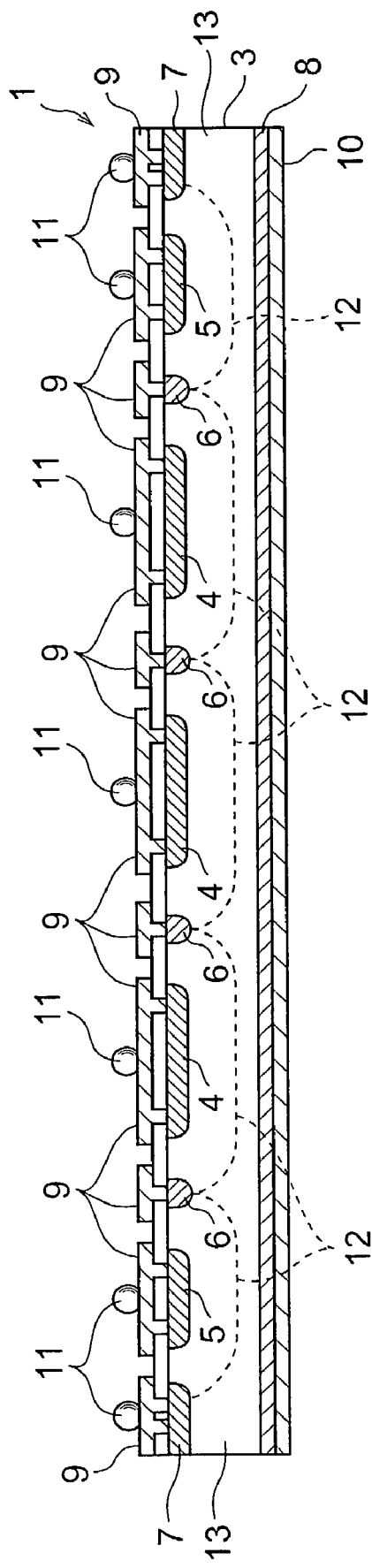
FIG. 4 is a schematic view showing a cross-sectional structure of the back-surface-incident-type photodiode array included in the energy ray detector.

First, in the case of using the photodiode array 1 by applying a positive bias voltage to the N$^+$ channel stop layers 6 and 7, depletion regions 12 in accordance with a size of the bias voltage are formed in the semiconductor substrate 3. In the photodiode array 1, when the bias voltage is being applied through the N$^+$ channel stop layers 6 and 7, as shown in FIG. 4, the depletion regions 12 adjacent to each other are connected below the N$^+$ channel stop layer 6 in a state where a voltage of approximately 100 V on the way of complete depletion is applied thereto. Thus, a state is brought, where a bias voltage more than or equal to the approximately 100 V described above cannot be applied to the N$^+$ channel stop layer 6. Note that, in a PIN-type photodiode using a high-resistance N-type silicon substrate having a specific resistance of 5 k$\Omega$·cm, which is the same as the semiconductor substrate 3, usually, the complete depletion is achieved by applying a bias voltage of approximately 110 V to 120 V.

However, the N$^+$ channel stop layer 7 wider than the N$^+$ channel stop layer 6 is provided on the outside of the array of the P$^+$ diffusion regions 4 and 5 continuously with the N$^+$ channel stop layer 6. Therefore, from below the N$^+$ channel stop layer 7 to the incident surface side of the semiconductor substrate 3, a region 13 is not depleted. Hence, since the region 13 where the depletion region 12 is not formed is provided from below the N$^+$ channel stop layer 7 to the incident surface side of the semiconductor substrate 3, the bias voltage can be applied to the N$^+$ diffusion region 8 through the N$^+$ channel stop layer 7 even after the adjacent depletion regions 12 are connected below the N$^+$ channel stop layer 6. Therefore, the depletion in the semiconductor substrate 3 can be further advanced.

Figure 5:
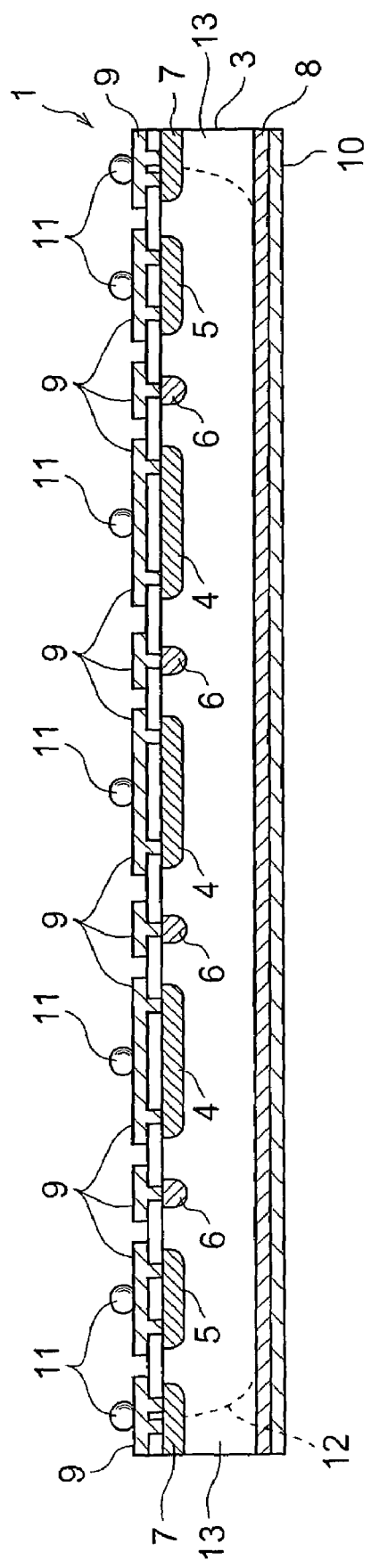
FIG. 5 is a schematic view showing a cross-sectional structure of the back-surface-incident-type photodiode array included in the energy ray detector.

The bias voltage is further applied continuously even after the depletion regions 12 reach the N$^+$ diffusion region 8, and thus it is possible to reduce or eliminate the insensitive region (depletion region 12) below the N$^+$ channel stop layer 6. By applying a bias voltage of approximately 200 V, as shown in FIG. 5, the depletion region 12 is expanded over the full incident surface (N$^+$ diffusion region 8) of the semiconductor substrate 3, and the semiconductor substrate 3 is put in a state of being completely depleted. Even in the state where the semiconductor substrate 3 is completely depleted, as shown in FIG. 5, the region 13 where the depletion region 12 is not formed is provided from below the N$^+$ channel stop layer 7 to the incident surface side of the semiconductor substrate 3.

In the state where the depletion region 12 reaches the N$^+$ diffusion region 8 of the semiconductor substrate 3, when the scintillation light is incident from the scintillator 2 onto the incident surface of the semiconductor substrate 3, a photoelectric current generated in the depletion region 12 is detected at a high speed in the photodiode array 1. Moreover, since the photodiode unit cells including the P$^+$ diffusion regions 4 and 5 are arranged in the form of matrix (multichannelized), an incident position of the scintillation light is also detected in the photodiode array 1.

When the depletion region 12 reaches to the periphery of the semiconductor substrate 3, a leakage current is increased. However, since the N$^+$ channel stop layer 7 is set wider than the N$^+$ channel stop layer 6, the region 13 where the depletion region 12 is not formed exists below the N$^+$ channel stop layer 7. Thus, it is possible to restrict the increase of the leakage current in the periphery of the semiconductor substrate 3.

As described above, the energy ray detector R includes the photodiode array 1 and the scintillator 2. On the surface side opposite to the incident surface of the semiconductor substrate 3 in the photodiode array 1, the P$^+$ diffusion regions 4 and 5 and the N$^+$ channel stop layers 6 and 7 are provided, and the scintillator 2 is optically connected to the incident surface side of the semiconductor substrate 3. As described above, since no electrode is provided on the incident surface side of the semiconductor substrate 3, no insensitive region caused by extracting an electrode is formed, thus making it possible to enlarge an area of a portion where it becomes possible to detect radiation.

Moreover, since no electrode is provided on the incident surface side of the semiconductor substrate 3, the incident surface side of the semiconductor substrate 3 can be planarized, thus facilitating the scintillator 2 to be optically connected thereto.

When the bias voltage is being applied through the N$^+$ channel stop layer 6, the adjacent depletion regions 12 are connected to each other below the N$^+$ channel stop layer 6, and the bias voltage cannot be applied to the N$^+$ channel stop layer 6 any more. However, since the N$^+$ channel stop layer 7 is provided on the semiconductor substrate 3 of the photodiode array 1, the region 13 where the depletion region 12 is not formed is provided from below the N$^+$ channel stop layer 7 to the incident surface side of the semiconductor substrate 3. Thus, even after the adjacent depletion regions 12 are connected to each other below the N$^+$ channel stop layer 6, the bias voltage can be continuously applied through the N$^+$ channel stop layer 7, and the depletion of the semiconductor substrate 3 can be further advanced, thus making it possible to completely deplete the semiconductor substrate 3. As a result of this, in the photodiode array 1, it becomes possible to restrict the lowering of a detection sensitivity and a response rate for the energy ray.

Moreover, the N$^+$ channel stop layer 7 set wider than the N$^+$ channel stop layer 6 is provided on the outside of the array of the P$^+$ diffusion regions 4 and 5, thus making it possible to provide the region 13 where the depletion region 12 is not formed in the portion of the semiconductor substrate 3 from the surface provided with the N$^+$ channel stop layers 6 and 7 to the incident surface. As a result of this, a constitution capable of providing the region 13 where the depletion region 12 is not formed can be realized simply at low cost.

Note that the photodiode array 1 is basically used in a completely depleted state where the depletion regions 12 are expanded over the full incident surface (N$^+$ diffusion region 8). In this completely depleted state, the depletion regions 12 are all connected below the N$^+$ channel stop layer 6, and the depletion regions 12 reach the vicinities of the peripheries of the semiconductor substrate 3. Since this expansion of the depletion regions 12 to the vicinities of the peripheries of the semiconductor substrate 3 can be adjusted by the applied bias voltage, even if the P$^+$ diffusion region 5 is made small, it is possible to expand the depletion region 12 to the vicinities of the peripheries of the semiconductor substrate 3. Thus, even in the case of setting the width (area) of the P$^+$ diffusion region 5 smaller than the width (area) of the P$^+$ diffusion region 4, carriers generated in the depletion region 12 are collected to the P$^+$ diffusion region 5. As a result of this, a reduction of the sensitive region of the photodiode array 1 is restricted, and a light sensitivity of the photodiode array 1 for the scintillation light is restricted from being affected.

Figure 6:
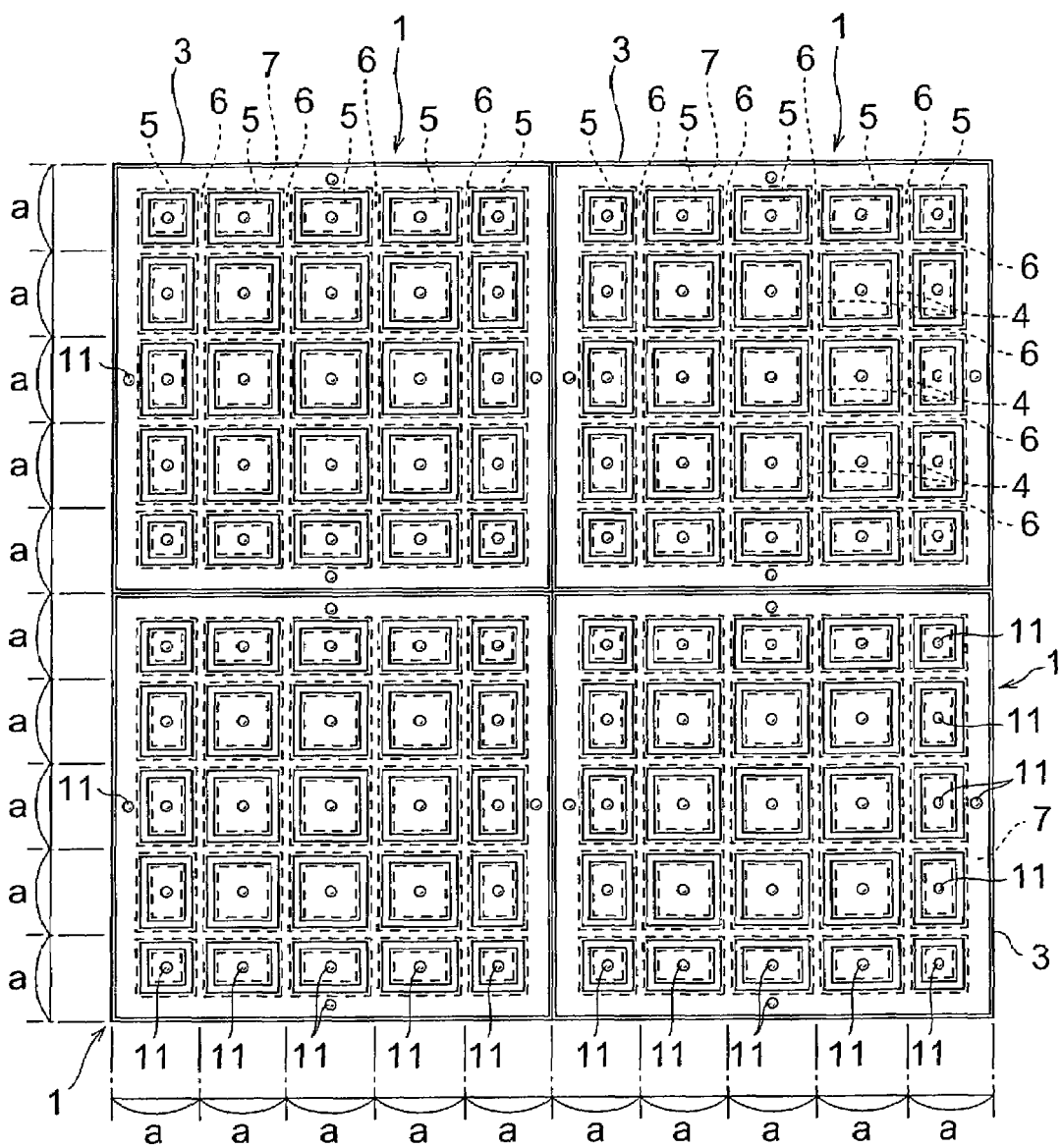
FIG. 6 is a plan view showing a state where the back-surface-incident-type photodiode arrays, each being included in the energy ray detector, are arrayed in the form of matrix.

Moreover, as shown in FIG. 6, the photodiode array 1 can be used such that a plurality of the photodiode arrays 1 are arrayed in the form of matrix.

The sum of the width of the P$^+$ diffusion region 5 that is adjacent to the N$^+$ channel stop layer 7 and the width of the N$^+$ channel stop layer 7 is set so as to be equal to the sum of the width of the P$^+$ diffusion region 4 that is not adjacent to the N$^+$ channel stop layer 7 and the width of the N$^+$ channel stop layer 6. Thus, as shown in FIG. 6, the width "a" of the photodiode unit cell (unit region) including the P$^+$ diffusion region 5 becomes equal to the width "a" of the photodiode unit cell (unit region) including the P$^+$ diffusion region 4. Thus, the areas of the photodiode unit cells (unit regions) in the photodiode array 1 become all equal. As a result of this, in the case of arranging the plurality of photodiode arrays 1 in the form of matrix, the energy ray can be readily detected by a large area, and the incident position of the energy ray can be suitably detected.

Note that the N$^+$ channel stop layer 7 does not have to be provided on the periphery of the semiconductor substrate 3, and may be provided on a position of any of the N$^+$ channel stop layers 6 (position between the photodiode unit cells). However, since the region 13 below the N$^+$ channel stop layer 7 is not depleted, an insensitive region exists between the photodiode unit cells of the photodiode array 1. Hence, in order to avoid two phenomena: an insensitive region exists between the photodiode unit cells of the photodiode array 1; and a leakage current is generated in the periphery of the semiconductor substrate 3, preferably, the N$^+$ channel stop layer 7 is provided on the periphery of the semiconductor substrate 3.

The present invention is not limited to the above-described embodiment, and the foregoing numerical values and the like can be appropriately changed and set. Moreover, the present invention can be applied to a variety of semiconductor energy detectors other than the radiation detector.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor energy detector, comprising:
    a semiconductor substrate comprised of a semiconductor of a first conductivity type, into which an energy ray of a predetermined wavelength range is incident from an incident surface thereof,
    wherein a plurality of diffusion regions of a second conductivity type comprised of a semiconductor of a second conductivity type and a diffusion region of the first conductivity type comprised of a semiconductor of the first conductivity type higher in impurity concentration than said semiconductor substrate are provided on a surface opposite to the incident surface of said semiconductor substrate;
    wherein a pn junction is formed at an area of interface between said semiconductor substrate and each of said diffusion regions of the second conductivity type, and each first conductivity type semiconductor substrate side of the pn junction formed at the area of interface between said semiconductor substrate and each of said diffusion regions of the second conductivity type, is commonly connected; and
    wherein said diffusion region of the first conductivity type has a plurality of portions surrounding each perimeter of the plurality of diffusion regions of the second conductivity type one by one, the plurality of portions being electrically connected to each other.

2. The semiconductor energy detector according to claim 1, wherein a scintillator is optically connected to the incident surface of said semiconductor substrate.

3. The semiconductor energy detector according to claim 1, wherein, in said semiconductor substrate, a region not being depleted from the surface opposite to the incident surface of said semiconductor substrate to the incident surface is provided in a completely depleted state where depletion is performed from the surface opposite to the incident surface of said semiconductor substrate to the incident surface.

4. The semiconductor energy detector according to claim 1, wherein said diffusion region of the first conductivity type includes:
    a first diffusion region of the first conductivity type for separating said diffusion regions of the second conductivity type, said first diffusion region of the first conductivity type being provided between said diffusion regions of the second conductivity type, and
    a second diffusion region of the first conductivity type formed to be wider than said first diffusion region of the first conductivity type, said second diffusion region of the first conductivity type being provided on the outside of an array of said diffusion regions of the second conductivity type, and,
    wherein the plurality of portions are formed by the first diffusion region of the first conductivity type and the second diffusion region of the first conductivity type.

5. The semiconductor energy detector according to claim 4, wherein a sum of a width of said diffusion region of the second conductivity type adjacent to said second diffusion region of the first conductivity type and a width of said second diffusion region of the first conductivity type is set equal to a sum of a width of said diffusion region of the second conductivity type not being adjacent to said second diffusion region of the first conductivity type and a width of said first diffusion region of the first conductivity type.

6. The semiconductor energy detector according to claim 4, wherein said second diffusion region of the first conductivity type is provided on a periphery of said semiconductor substrate.

7. The semiconductor energy detector according to claim 1, wherein said diffusion regions of the second conductivity type are arrayed at a predetermined interval,
    a first diffusion region of the first conductivity type for separating said diffusion regions of the second conductivity type is provided between said diffusion regions of the second conductivity type, said first diffusion region of the first conductivity type being comprised of the semiconductor of the first conductivity type higher in impurity concentration than said semiconductor substrate, and
    on an outside of an array of said diffusion regions of the second conductivity type, a second diffusion region of the first conductivity type is provided, said second diffusion region of the first conductivity type being formed to be wider than said first diffusion region of the first conductivity type and being comprised of the semiconductor of the first conductivity type higher in impurity concentration than said semiconductor substrate, and wherein the plurality of portions are formed by the first diffusion region of the first conductivity type and the second diffusion region of the first conductivity type.

8. The semiconductor energy detector according to claim 7, wherein a sum of a width of said diffusion region of the second conductivity type adjacent to said second diffusion region of the first conductivity type and a width of said second diffusion region of the first conductivity type is set equal to a sum of a width of said diffusion region of the second conductivity type not being adjacent to said second diffusion region of the first conductivity type and a width of said first diffusion region of the first conductivity type.

9. The semiconductor energy detector according to claim 7, wherein said second diffusion region of the first conductivity type is provided on a periphery of said semiconductor substrate.

10. The semiconductor energy detector according to claim 4, wherein said first diffusion region of the first conductivity type exhibits a lattice shape so as to surround said diffusion region of the second conductivity.

11. A semiconductor energy detector, comprising:

a semiconductor substrate comprised of a semiconductor of a first conductivity type, into which an energy ray of a predetermined wavelength range is incident from an incident surface thereof, wherein a plurality of diffusion regions of a second conductivity type comprised of a semiconductor of a second conductivity type and a diffusion region of the first conductivity type comprised of a semiconductor of the first conductivity type higher in impurity concentration than said semiconductor substrate are provided on a surface opposite to the incident surface of said semiconductor substrate;

wherein a pn junction is formed at an area of interface between said semiconductor substrate and each of said diffusion regions of the second conductivity type, and each first conductivity type semiconductor substrate side of the pn junctions formed at the area of interface between said semiconductor substrate and each of said diffusion regions of the second conductivity type, is commonly connected; and wherein said diffusion region of the first conductivity type has a plurality of portions surrounding each perimeter of the pn junctions one by one, the plurality of portions being electrically connected to each other.

12. The semiconductor energy detector according to claim 11, wherein said diffusion region of the first conductivity type includes a first diffusion region of the first conductivity type exhibiting a lattice shape so as to surround the pn junction and a second diffusion region of the first conductivity type formed to be wider than said first diffusion region of the first conductivity type.

13. The semiconductor energy detector according to claim 4, wherein said second diffusion region of the first conductivity type is provided on the outside of an array of said diffusion regions of the second conductivity type.

14. The semiconductor energy detector according to claim 12, wherein said second diffusion region of the first conductivity type is provided on the outside of an array of the pn junctions.

15. The semiconductor energy detector according to claim 7, wherein said first diffusion region of the first conductivity type exhibits a lattice shape so as to surround said diffusion region of the second conductivity.

* * * * *